United States Patent
Koyama et al.

(10) Patent No.: US 6,299,680 B1
(45) Date of Patent: Oct. 9, 2001

(54) CDTE CRYSTAL OR CDZNTE CRYSTAL AND METHOD FOR PREPARING THE SAME

(75) Inventors: Akio Koyama; Ryuichi Hirano, both of Kitaibaraki (JP)

(73) Assignee: Japan Energy Corporation, Tokyo (JP)

( * ) Notice: Subject to any disclaimer, the term of this patent is extended or adjusted under 35 U.S.C. 154(b) by 0 days.

(21) Appl. No.: 09/462,268

(22) PCT Filed: Apr. 14, 1999

(86) PCT No.: PCT/JP99/01972

§ 371 Date: Jan. 6, 2000

§ 102(e) Date: Jan. 6, 2000

(87) PCT Pub. No.: WO99/59199

PCT Pub. Date: Nov. 18, 1999

(30) Foreign Application Priority Data

May 11, 1998 (JP) ................................................. 10-127211

(51) Int. Cl.[7] .............................. C30B 29/48; C30B 11/00
(52) U.S. Cl. ...................... 117/2; 117/3; 117/81; 117/82; 117/83; 117/956; 117/957; 423/99; 423/508
(58) Field of Search ................................. 117/23, 81, 82, 117/83, 956, 957; 423/99, 508, 509

(56) References Cited

U.S. PATENT DOCUMENTS

| 5,229,321 | * | 7/1993 | Takami | 437/161 |
| 5,262,349 | * | 11/1993 | Yoshida | 437/160 |
| 5,535,699 | * | 7/1996 | Kawazu et al. | 117/1 |

FOREIGN PATENT DOCUMENTS

| A62174928 | 7/1931 | (JP) . |
| 03-91935 | * 4/1991 | (JP) .................................. 117/2 |
| A3126693 | 5/1991 | (JP) . |
| A497991 | 3/1992 | (JP) . |
| 4244950 | 9/1992 | (JP) . |
| A8217600 | 8/1996 | (JP) . |
| WO 9522643 | 8/1995 | (WO) . |

OTHER PUBLICATIONS

J. Shen et al.; Effect of Thermal Annealing on the . . . ; vol. B16, No. 1 Jan. 30, 1993; pp. 182–185.*

* cited by examiner

*Primary Examiner*—Robert Kunemund
(74) *Attorney, Agent, or Firm*—Birch, Stewart, Kolasch & Birch, LLP

(57) ABSTRACT

An object of the present invention is to reduce the etch pit density (EPD) and the full-width-half-maximum (FWHM) value of the double crystal X-ray rocking curve, and to provide a CdTe crystal or a CdZnTe crystal which does not include deposits having Cd or Te and the process for producing the same. After a CdTe crystal or a CdZnTe crystal was grown, while the temperature of the crystal is from 700 to 1050° C., the Cd pressure is adjusted so as to keep the stoichiometry of the crystal at the above temperature. The crystal is left for time t which is determined so that each of a diameter $L(r)$ of the crystal and a length $L(z)$ thereof satisfies the following equation 1:

$$\{L(r),(L(z))\}/2 < \{4\exp(-1.15/kT) \times t\}^{1/2}.$$

Then, when the crystal is cooled, the temperature of the crystal is decreased within a range in which the temperature of the crystal and that of a Cd reservoir satisfy the following equation 2:

$$-288 + 1.68 \times T_{Cd} < T_{CdTe} < 402 + 0.76 \times T_{Cd}.$$

5 Claims, 2 Drawing Sheets

CDTE CRYSTAL OR CDZNTE CRYSTAL AND METHOD FOR PREPARING THE SAME

This application is the national phase under 35 U.S.C. §371 of PCT International Application No. PCT/JP99/01972 which has an International filing date of Apr. 14, 1999, which designated the United States of America.

TECHNICAL FIELD

The present invention relates to a compound semiconductor single crystal and a process for producing the same. In particular, the present invention relates to an effective producing technique which is applied to a CdTe crystal or a CdZnTe crystal.

BACKGROUND ON THE INVENTION

Compound semiconductor single crystals, such as cadmium telluride (CdTe), cadmium zinc telluride (CdZnTe) and the like, have advantages that a light emission efficiency thereof is higher than that of silicon (Si) and that a heterojunction can be applied thereto. The compound semiconductor single crystals are expected to be applied to a light emitting element, a photodetector, a low-noise amplifier, or the like.

In particular, a CdTe crystal has a zinc blende structure, has a property that an energy gap thereof is 1.5 V and is a material which can have both a p-type conductivity and an n-type conductivity. Therefore, the CdTe crystal is used for semiconductor devices, such as a substrate for an epitaxial growth of an infrared detector, a solar battery, a visible light sensor, an infrared sensor, a radiation detector for γ-ray or for X-ray, a non-destructive detector and an HgCdTe mixed crystal epitaxy (a far infrared detector), or the like.

Because many properties of these devices depend on a purity of a compound semiconductor single crystal for forming a substrate, it is desired to obtain a high purity compound semiconductor single crystal in order to improve performance of the devices.

Conventionally, a CdTe crystal or a CdZnTe crystal is produced by the Bridgman method (Bridgman Method), the gradient freezing method (Gradient Freezing Method: GF method), the vertical gradient freezing method (Vertical Gradient Freezing Method: VGF method) or the like. However, there is a problem that a grown crystal includes many deposits having Cd or Te, which cause the properties of these devices to be lower (for example, a deterioration in performance to detect infrared ray).

The method for reducing deposits having Cd or Te has been studied. For example, the reducing method is reported by H. R. VYDYANATH et al. Journal of Electronic Materials, Vol. 22, No 8, 1993 (p. 1073).

The above method for reducing deposits having Cd or Te was that a grown bulk CdTe crystal or CdZnTe crystal was cut in a wafer form to carry out a predetermined heat treatment.

However, when the above heat treatment was carried out to the crystal, there was a problem that a full-width-half-maximum (FWHM value) of a double crystal X-ray rocking curve became higher than that of the crystal to which the heat treatment was not carried out.

When the FWHM value of the double crystal X-ray rocking curve thereof was high, after the HgCdTe mixed crystal epitaxy, the FWHM value of the double crystal X-ray rocking curve of the surface of the grown HgCdTe mixed crystal became high. There was a problem that the property of a photodiode manufactured by using the epitaxy was deteriorated.

Further, there was a problem that an etch pit density (EPD) of the CdTe crystal or that of the CdZnTe crystal became high after the heat treatment.

That is, for example, an experience in which the heat treatment was carried out to the CdTe substrate or the CdZnTe substrate under Cd pressure atmosphere, at 850° C. and for 20 hours was attempted. It was found that the EPD value which was $4\times10^4$ cm$^{-2}$ before the heat treatment, increased to $1.2\times10^5$ cm$^{-2}$ after the heat treatment.

The inventors studied about the above-described situations. As a result, the present invention was completed. An object of the present invention is to reduce the etch pit density (EPD) and the full-width-half-maximum (FWHM) value of the double crystal X-ray rocking curve, and to provide a CdTe crystal or a CdZnTe crystal which does not include deposits having Cd or Te and the process for producing the same.

DISCLOSURE OF THE INVENTION

In order to accomplish the above-described object, the process for producing a CdTe crystal or a CdZnTe crystal comprises the steps of; growing a CdTe crystal or a CdZnTe crystal, keeping a temperature of the grown crystal from 700 to 1050° C., adjusting a Cd pressure so as to keep a stoichiometry of the crystal at the temperature, leaving the crystal for time t which is determined so that each of a diameter L(r) of the crystal and a length L(z) thereof satisfies equation 1, and cooling the left crystal so that the temperature of the crystal is decreased within a range in which the temperature of the crystal and that of a Cd reservoir satisfy equation 2;

$$\{L(r),(L(z))\}/2 < \{4\exp(-1.15/kT)\times t\}^{1/2} \quad \text{equation 1}$$

where k is Boltzmann's constant,

T is an absolute temperature, t is time (second), and $\{4\exp(-1.15/kT)\times t\}^{1/2}$ is a chemical diffusion distance (cm), and $$-288+1.68\times T_{Cd} < T_{CdTe} < 402+0.76\times T_{Cd} \quad \text{equation 2}$$

where $T_{CdTe}$ is the temperature of the crystal, and $T_{Cd}$ is the temperature of the Cd reservoir.

The step of growing the CdTe crystal or the CdZnTe crystal may be carried out by a vapor pressure (Cd pressure) control method, a VGF method or an HB method.

It is preferable to provide a CdTe crystal or a CdZnTe crystal including no deposits having Te or Cd, which have a particle diameter of not less than 1 μm, wherein an etch pit density (EPD) of the crystal is not more than $5\times10^4$ cm$^{-2}$, and a full-width-half-maximum (FWHM) of a double crystal X-ray rocking curve of the crystal is not more than 20S.

The crystal may be an n-type of CdTe crystal or an n-type of CdZnTe crystal, or may be a p-type of CdTe crystal or a p-type of CdZnTe crystal.

Hereinafter, the consideration for accomplishing the present invention and the research therefor will be summarized by the inventors.

The inventors have studied on the basis of the reasoning in which the deposits having Te or Cd can be reduced not by carrying out the heat treatment after the grown CdTe crystal or the grown CdZnTe crystal is taken out from a reactor and is cut in a wafer form like an earlier technology, but by contriving heat treatment condition in a state that the crystal was grown, that is, in a state that the crystal was set to the reactor.

With respect to the above-described method, the process for producing a II–VI group compound semiconductor crystal has been proposed by Asahi et al (See Japanese Patent Application No. Tokukai-Hei 3-126693).

The producing process was as follows. While a vapor pressure of the component element of the grown crystal was applied to the grown crystal after the crystal growth was finished, the diffusion of the component element was promoted at a predetermined heat treatment temperature which was lower than the melting point of the crystal. The crystal was held at the predetermined heat treatment temperature for a predetermined time. The heat treatment was carried out in order to restrain the growth of the deposits in the grown crystal. The grown crystal was slowly cooled to a room temperature after the heat treatment step was finished.

However, although the inventors repeatedly carried out a precise experience with respect to the case of producing the CdTe crystal by using the above method, it was found that contrary to the inventors' expectations, the density of the deposits having Te or Cd increased according to the condition even though the heat treatment was carried out to the grown crystal under the vapor pressure of the component element and the grown crystal was slowly cooled.

In the Japanese Patent Application No. Tokukai-Sho 63-79797, Miyazaki discloses the following technical idea. In the process for producing a II–VI group compound semiconductor single crystal, when a reactor is slowly cooled to a room temperature after the growth of the single crystal was finished, the temperature of the vapor pressure controlling part is decreased. Because the amount of evaporation is reduced in the vapor pressure controlling part and the vapor pressure drops in the reactor, inert gas is introduced.

However, when an experience in which the CdTe crystal was produced was carried out with respect to the above process, it was found that the deposits having Te or Cd cannot be reduced, for example, by simply applying Cd pressure which was not less than 1.5 atm.

The inventors have researched into each condition, such as heat treatment temperature, pressure or time, for changing a crystal which becomes non-stoichiomeric when the crystal is grown, into a stoichiometric crystal by applying Cd pressure and carrying out the heat treatment in a state in which the grown crystal remains set in a crystal growing apparatus after the growth of the CdTe crystal or that of the CdZnTe crystal was finished.

In order to study the conditions, it was necessary that a condition in which Cd sufficiently diffuses in the CdTe crystal or the CdZnTe crystal was grasped.

In this case, in consideration of the diffusion coefficient of Cd which is related to the stoichiometry, not a self-diffusion coefficient but a chemical diffusion coefficient disclosed by Kenneth Zanio in "Journal of Applied Physics, Volume 41, No. 5, April 1970, p1935-" was used.

On the other hand, with respect to the temperature control to be carried out during the cooling step, both the temperature of the Cd reservoir and that of the crystal were controlled. After the crystal was cooled under various conditions and was cut in a wafer form and the surface of the crystal was mirror-polished, an existence of the deposit was observed by an IR microscope. When the temperature control is carried out, it is preferable to keep an equilibrium state with the CdTe crystal temperature.

A theoretical calculation of the temperature of the Cd reservoir was carried out in view of the equation, $$\log_{10} P = -5218/T + 7.897 \qquad \text{(T: absolute temperature)}$$

denoting a temperature dependency of Cd vapor pressure, which was disclosed in the Zanio's report.

From a result of the research, the inventors strongly believed that the CdTe crystal or the CdZnTe crystal, in which the deposits having Te or Cd were drastically reduced could be obtained by optimizing the heat treatment condition, such as a cooling condition (a condition for decreasing temperature) or the like.

As described above, the heat treatment condition is that while the temperature of the grown CdTe crystal or that of the grown CdZnTe crystal is from 700 to 1050° C., the Cd pressure is adjusted so as to keep the stoichiometry of the crystal at the above temperature. Further, the crystal is left for the time t which is determined so that each of the diameter L(r) of the crystal and the length L(z) thereof satisfies the equation 1. Then, when the crystal is cooled, the temperature of the crystal is decreased within the range in which the temperature of the crystal and that of the Cd reservoir satisfy the equation 2. As a result, the heat treatment condition can be optimized. On the basis of the above ideas, the present invention can be accomplished.

According to the present invention, the high quality CdTe crystal or CdZnTe crystal including no deposits having Te or Cd, which have a particle diameter of not less than 1 μm can be obtained.

By using the substrate made of such a CdTe crystal or a CdZnTe crystal, in which the deposits having Te or Cd are reduced, for example, when the epitaxial growth of the HgCdTe mixed crystal is carried out, the high density crystal defect which is caused by the deposits like an earlier development can be removed. By using high quality epitaxial surface, a semiconductor device having an excellent property can be manufactured.

BEST MODE OF THE INVENTION

Hereinafter, as an example of the preferred embodiments of the present invention, the process for producing the CdZnTe crystal, to which the producing process according to the present invention is applied will be explained with reference to FIGS. 1 and 2.

Figure 1:
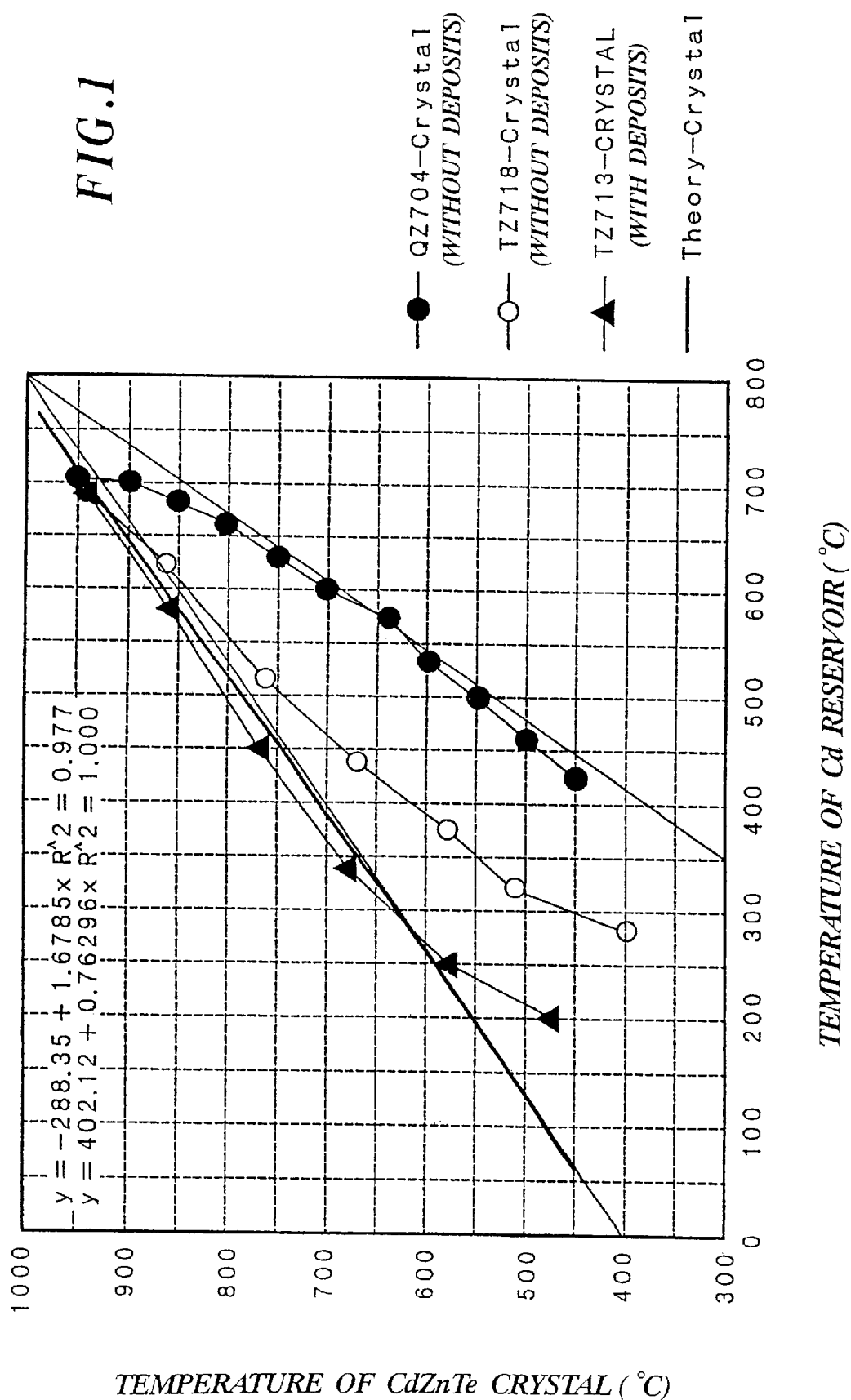
FIG. 1 is a graph showing the relationship between the temperature of the crystal and that of the Cd reservoir in the cooling step of the process for producing the CdZnTe crystal according to the present invention.

FIG. 1 is a graph showing the relationship between the temperature of the crystal and that of the Cd reservoir in the cooling step. FIG. 2 is a graph showing a correlation between the full-width-half-maximum (FWHM) of a double crystal X-ray rocking curve of the CdZnTe crystal and the etch pit density (EPD) thereof.

In the present embodiment, a CdZnTe crystal (Zn: 3.5%) having a size of 3"φ×6 cm and a mass of 1500 g was grown by the VGF method. After the crystal growing step was finished, the temperature of the crystal was decreased to 950° C. From the result of the experience, it is confirmed that when the temperature of the crystal is from 700 to 1050° C., the same effect can be obtained.

In order to keep the stoichiometry of the crystal at the temperature (950° C.) of the crystal, Cd pressure was adjusted to 0.15 atm, and the crystal was left for about 20 hours.

In this case, when the diameter of the above grown crystal $L(r)=3"\phi$, the length thereof $L(z)=6$ cm, the temperature of the crystal $T=950°$ C. and the diffusion time $t=20$ hours (72000 seconds) are substituted for the following equation, $$\{L(r),(L(z))\}/2<\{4\exp(-1.15/kT)\times t\}^{1/2},$$

where k: Boltzmann's constant,

T: absolute temperature, t: time (second), and $\{4\exp(-1.15/kT)\times t\}^{1/2}$: chemical diffusion distance (cm), the right side of the equation is about 5.0 cm.

In this case, because the following conditions $$L(r)/2=3.8 \text{ cm}<5.0 \text{ cm}$$

$$L(z)/2=3.0 \text{ cm}<5.0 \text{ cm}$$

are satisfied, it is thought that Cd diffuses over the whole crystal sufficiently.

Then, under various cooling conditions in which the temperature of the crystal and that of the Cd reservoir satisfy the following equation, $$-288+1.68\times T_{Cd}<T_{Cd(Zn)Te}<402+0.76\times T_{Cd},$$

where $T_{Cd(Zn)Te}$: temperature of crystal and $T_{Cd}$: temperature of Cd reservoir, the temperature of the CdZnTe crystal and that of the Cd reservoir were decreased to a room temperature. Then, it was observed by using the IR microscope whether the deposits were caused in the CdZnTe crystal or not.

As a result, the graph showing the relationship between the temperature of the CdZnTe crystal and that of the Cd reservoir in the cooling step was obtained as shown in FIG. 1.

In FIG. 1, Theory-Crystal denotes the equilibrium vapor pressure as a theoretical value of the CdZnTe crystal.

QZ704-Crystal, TZ718-Crystal and TZ713-Crystal are the CdZnTe crystal according to the present invention, which are grown in the respective conditions that the temperature of the crystal and that of the Cd reservoir are varied in the cooling step.

The TZ713-Crystal is the crystal which was cooled slightly closer to the Te-rich region as compared with the theoretical value. In this case, when the TZ713-Crystal was observed by the IR microscope, the existence of the deposits having Te, which have a diameter of about 2 μm was confirmed. That is, in the condition for decreasing temperature, in which the crystal was cooled slightly closer to the Te-rich region as compared with the theoretical value, the deposits having a particle diameter of not more than 1 μm could not reduced.

On the other hand, the QZ704-Crystal and the TZ718-Crystal are the crystals which were cooled to a room temperature closer to the Cd-rich region as compared with the theoretical value so as to satisfy the above cooling conditions. In these cases, when the QZ704-Crystal and the TZ718-Crystal were observed by the IR microscope, the deposits having Te or Cd were not detected at all in both crystals.

With respect to the TZ713-Crystal, the TZ718-Crystal and the QZ704-Crystal, the etch pit density (EPD) and the full-width-half-maximum (FWHM) value of a double crystal X-ray rocking curve were measured. The results thereof were obtained as shown in Table 1.

In Table 1, in the case of the TZ713-Crystal, when the upper layer of the crystal, the middle layer thereof and the lower layer thereof were observed by the IR microscope, the deposits having a diameter of about 2 μm were detected. The EPD of the upper layer was $1\times10^4$ cm$^{-2}$, that of the middle layer was $1\times10^4$ cm$^{-2}$, and that of the lower layer was $3\times10^4$ cm$^{-2}$. The FWHM value of the upper layer was 8S, that of the middle layer was 12S, and that of the lower layer was 12S.

In the case of the TZ718-Crystal, when the upper layer of the crystal, the middle layer thereof and the lower layer thereof were observed by the IR microscope, the deposits were unobserved. The EPD of the upper layer was $3\times10^4$ cm$^{-2}$, that of the middle layer was $2\times10^4$ cm$^{-2}$, and that of the lower layer was $3\times10^4$ cm$^{-2}$. The FWHM value of the upper layer was 19S, that of the middle layer was 19S, and that of the lower layer was 18S.

In the case of the QZ704-Crystal, when the upper layer of the crystal, the middle layer thereof and the lower layer thereof were observed by the IR microscope, the deposits were unobserved. The EPD of the upper layer was $1\times10^4$ cm$^{-2}$, that of the middle layer was $2\times10^4$ cm$^{-2}$, and that of the lower layer was $3\times10^4$ cm$^{-2}$. The FWHM value of the upper layer was 11S, that of the middle layer was 10S, and that of the lower layer was 12S.

TABLE 1

| Crystal | IR microscope observation | EPD (cm$^{-2}$) | FWHM (S) |
|---|---|---|---|
| TZ713 -(upper layer) | 2 μm | $1 \times 10^4$ | 8 |
| -(middle layer) | 2 μm | $1 \times 10^4$ | 12 |
| -(lower layer) | 2 μm | $3 \times 10^4$ | 12 |
| TZ718 -(upper layer) | unobserved | $3 \times 10^4$ | 19 |
| -(middle layer) | unobserved | $2 \times 10^4$ | 19 |
| -(lower layer) | unobserved | $3 \times 10^4$ | 18 |
| QZ704 -(upper layer) | unobserved | $1 \times 10^4$ | 11 |
| -(middle layer) | unobserved | $2 \times 10^4$ | 10 |
| -(lower layer) | unobserved | $3 \times 10^4$ | 12 |

Figure 2:
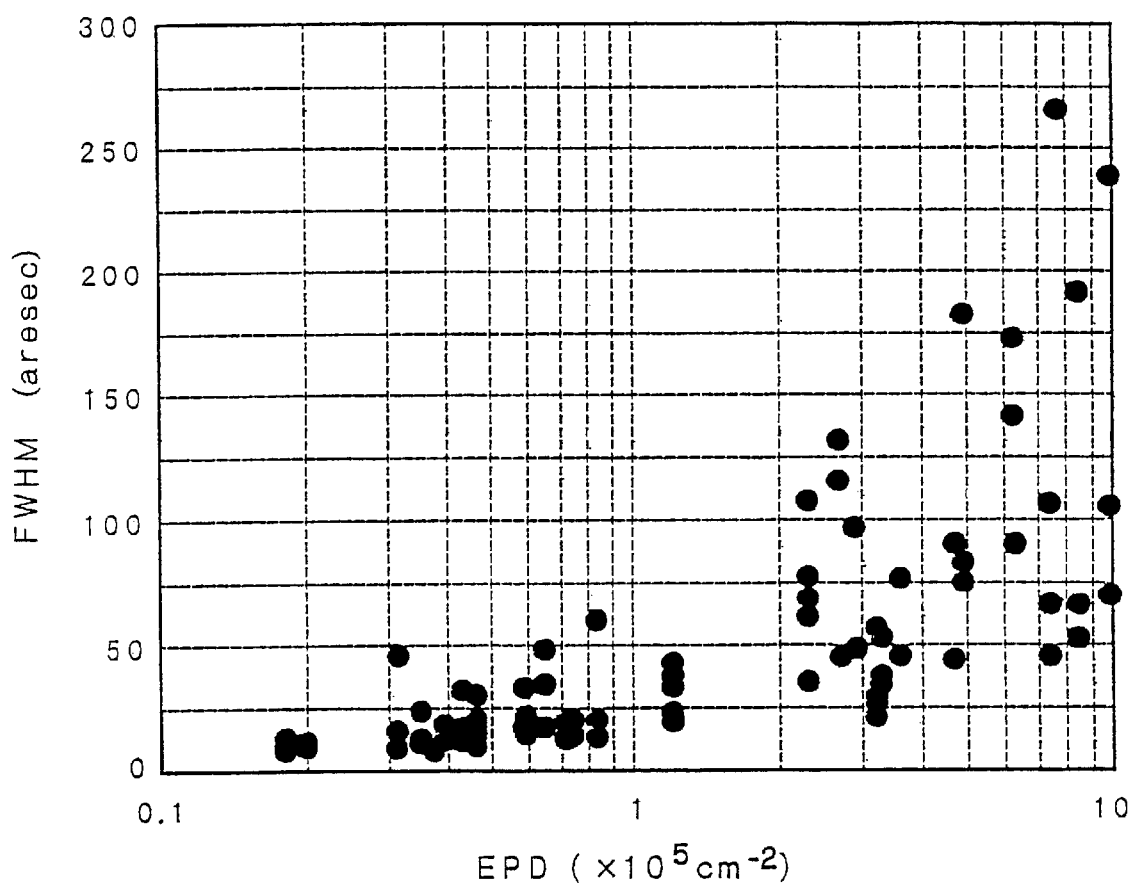
FIG. 2 is a graph showing a correlation between the full-width-half-maximum (FWHM) of a double crystal X-ray rocking curve of the CdZnTe crystal and the etch pit density (EPD) thereof.

The correlation between the EPD and the FWHM is shown in the graph of FIG. 2.

As described above, in the producing process according to the present invention, high quality CdZnTe crystal in which EPD is less than $5\times10^4$ cm$^{-2}$ (EPD<$5\times10^4$ cm$^{-2}$) and FWHM is less than 20S (FWHM<20S) can be obtained.

Therefore, as described above, by using the substrate made of a CdZnTe crystal, in which the deposits having Te or Cd are reduced, for example, when the epitaxial growth of the HgCdTe mixed crystal is carried out, the high density crystal defect which is caused by the deposits like an earlier development can be removed. By using high quality epitaxial surface, it can be expected that a semiconductor device having an excellent property is manufactured.

Although the production of the CdZnTe crystal was explained in the above embodiment, the present invention is not limited to this. By producing the CdTe crystal similarly, high quality crystals in which the deposits having Te or Cd are reduced can be obtained.

Although the VGF method was exemplified as a crystal growing method in the above embodiment, the present invention is not limited to this. The vapor pressure (Cd pressure) control method or the horizontal Bridgman method (HB method) can be applied.

Although the CdZnTe crystal having a size of 3"φ×6 cm and a mass of 1500 g was exemplified in the above embodiment, the present invention is not limited to this. If only the diameter of the crystal and the length thereof satisfy the above-described cooling conditions, the crystal may have any size.

INDUSTRIAL APPLICABILITY

According to the present invention, the high quality CdTe crystal or CdZnTe crystal including no deposits having Te or Cd, which have a particle diameter of not less than 1 μm can be obtained. By using the substrate made of such a CdTe crystal or a CdZnTe crystal, in which the deposits having Te or Cd are reduced, for example, when the epitaxial growth of the HgCdTe mixed crystal is carried out, the high density crystal defect which is caused by the deposits like an earlier development can be removed. By using high quality epitaxial surface, it is possible that a semiconductor device having an excellent property is manufactured.

What is claimed is:

1. A CdTe crystal or a CdZnTe crystal, wherein deposits comprising Te or Cd are not observable by an IR microscope, an etch pit density (EPD) of the crystal is not more than $3 \times 10^4$ cm$^{-2}$, and a full-width-half-maximum (FWHM) of a double crystal X-ray rocking curve of the crystal is not more than 20s.

2. A CdTe crystal or a CdZnTe crystal as claimed in claim 1, wherein the crystal is an n-type CdTe crystal or an n-type CdZnTe crystal.

3. A CdTe crystal or a CdZnTe crystal as claimed in claim 1, wherein the crystal is a p-type CdTe crystal or a p-type CdZnTe crystal.

4. A process for producing a CdTe crystal or a CdZnTe crystal as claimed in claim 1, comprising the steps of growing a CdTe crystal or a CdZnTe crystal, maintaining a temperature of the grown crystal from 700 to 1050° C., adjusting a Cd pressure so as to maintain a stoichiometry of the crystal at said temperature, maintaining the crystal for time t which is determined so that each of a diameter L(r) of the crystal and a length L(z) of the crystal satisfies the equation $$\{L(r),L(z))\}/2 < \{4\exp(-1.15/kT) \times t\}^{1/2}$$

wherein k is Boltzmann's constant, T is an absolute temperature, t is time (in seconds), and $\{4\exp(-1.15/kT) \times t\}^{1/2}$ is a chemical diffusion distance (in centimeters), and cooling the remaining crystal so that the temperature of the crystal is decreased within a range in which the temperature of the crystal and that of a Cd reservoir satisfy the equation $$-288 + 1.68 \times T_{Cd} < T_{CdTe} < 402 + 0.76 \times T_{Cd}$$

where $T_{CdTe}$ is the temperature of the crystal and $T_{Cd}$ is the temperature of the Cd reservoir.

5. A process for producing a CdTe crystal or a CdZnTe crystal as claimed in claim 4, wherein the step of growing the CdTe crystal or the CdZnTe crystal is carried out by a vapor pressure (Cd pressure) control method, a VGF method, or an HB method.

* * * * *